United States Patent
Huang et al.

(10) Patent No.: US 7,465,632 B2
(45) Date of Patent: Dec. 16, 2008

(54) METHOD FOR FORMING BURIED DOPED REGION

(75) Inventors: Chiu-Tsung Huang, Hsinchu (TW); Su-Yuan Chang, Hsinchu Hsien (TW)

(73) Assignee: Powerchip Semiconductor Corp., Hsinchu (TW)

( * ) Notice: Subject to any disclaimer, the term of this patent is extended or adjusted under 35 U.S.C. 154(b) by 461 days.

(21) Appl. No.: 11/163,728

(22) Filed: Oct. 28, 2005

(65) Prior Publication Data

US 2006/0216915 A1   Sep. 28, 2006

(30) Foreign Application Priority Data

Mar. 25, 2005  (TW) ............................ 94109246 A

(51) Int. Cl.
*H01L 21/336* (2006.01)

(52) U.S. Cl. .................... 438/262; 257/E21.537; 257/E21.644; 438/526

(58) Field of Classification Search ................. 438/156, 438/212, 526, 524, 434, 262; 257/E21.537, 257/E21.644
See application file for complete search history.

(56) References Cited

U.S. PATENT DOCUMENTS

| | | | |
|---|---|---|---|
| 5,028,566 A * | 7/1991 | Lagendijk ................... 438/784 |
| 6,011,272 A * | 1/2000 | Omid-Zohoor et al. ....... 257/44 |
| 6,716,699 B2 * | 4/2004 | Cho et al. .................... 438/257 |
| 6,750,098 B2 * | 6/2004 | Schlosser et al. ............ 438/244 |

\* cited by examiner

*Primary Examiner*—Asok K Sarkar
(74) *Attorney, Agent, or Firm*—Jianq Chyun IP Office

(57) ABSTRACT

A method for forming a buried doped region is provided. A first insulating layer is formed on a substrate and the first insulating layer is patterned to from an opening that extends in a first direction. A buried doped region is formed in the substrate exposed by the opening. Thereafter, a second insulating layer is formed on the substrate to fill the opening. The second insulating layer together with the first insulation layer form a third insulating layer. The third insulating layer is patterned to form an isolation layer that exposes the substrate and the buried doped region. The isolation layer extends in a second direction and crosses over the first direction. A semiconductor layer is formed on the substrate to fill the areas on the respective sides of the isolation layer.

21 Claims, 2 Drawing Sheets

METHOD FOR FORMING BURIED DOPED REGION

CROSS-REFERENCE TO RELATED APPLICATION

This application claims the priority benefit of Taiwan application Ser. No. 94109246, filed on Mar. 25, 2005. All disclosure of the Taiwan application is incorporated herein by reference.

BACKGROUND OF THE INVENTION

1. Field of the Invention

The present invention relates to a method of forming a semiconductor device structure. More particularly, the present invention relates to a method of forming a buried doped region underneath an isolation layer.

2. Description of the Related Art

Among the types of semiconductor devices, metal-oxide-semiconductor (MOS) is one of most important and widely used semiconductor devices because of its low power consumption and suitability for high density integration.

In general, the gate and the source/drain regions of a MOS device are fabricated on the surface of a substrate. The gate is disposed on the surface of a wafer and the source/drain regions are disposed on the two sides of the gate. The channel region underneath the gate and between the source/drain regions is formed in parallel to the surface of the substrate, the so-called horizontal channel structure. However, with the increase in the level of integration of the semiconductor devices, the size of each MOS device is reduced. As the MOS device is miniaturized, the channel length is reduced and the operating speed of the semiconductor device is increased. Yet, the length of the channel cannot be reduced without limit. When the channel length is reduced to a critical level, abnormal punch through between the source and the drain will occur with higher frequency and the so-called short channel effect such as the hot electron effect will intensify so that the electrical performance of the device can be seriously affected.

On the other hand, the channel length of the aforementioned horizontal type device is mainly determined by the length of the gate and the gate is fabricated by performing photolithographic and etching process. Since any photolithographic process has the so-called critical dimension (CD) problem, the gate line width will encounter a barrier to further reduction and hence the miniaturization of the semiconductor devices.

As a result, the semiconductor industry has developed a trench semiconductor manufacturing technique, in which the MOS device is fabricated within the trenches. For example, the source/drain regions are formed on the top and the bottom of the trench and the gate is formed within the trench. The channel region between the source/drain regions is set up in a direction perpendicular to the surface of the substrate to form the so-called vertical channel device. Because the channel length in the trench type semiconductor device is dependent upon the depth of the trench, critical dimension (CD) problem related to a photolithographic process can be avoided. Hence, the dimension of each device can be minimized and their area occupation on the wafer can be reduced. In other words, the level of integration of the semiconductor devices can be increased.

However, in the aforementioned trench-type semiconductor device, one of the source/drain regions (the doped region) is disposed at the bottom of the trench. Typically, the source/drain region (the doped region) is formed at the bottom of the device isolation structure or the bottom of the trench in an ion implant process after forming the device isolation structure (for example, a shallow trench isolation (STI) structure). Because dopants need to penetrate the device isolation structure (the shallow trench isolation (STI) structure) in the ion implant process, the implant depth of the dopants is increased. With a larger implant depth, not only is the process of implanting dopants to an appropriate depth more difficult but a larger amount of the energy is also needed to accelerate the ions to the required level for the ion implant process. Ultimately, the ion implant process is more difficult to control and a higher production cost is incurred.

SUMMARY OF THE INVENTION

Accordingly, at least one objective of the present invention is to provide a method for forming a buried doped region. The method includes fabricating the buried doped region before forming an isolation layer so that the depth in an ion implant process is reduced and the energy needed to implant dopants is cut back.

To achieve these and other advantages and in accordance with the purpose of the invention, as embodied and broadly described herein, the invention provides a method for forming a buried doped region. First, a substrate is provided. Then, a first insulating layer is formed on the substrate. The first insulating layer is patterned to form an opening that extends in a first direction. A buried doped region is formed in the substrate exposed by the opening. Thereafter, a second insulating layer is formed on the substrate to fill the opening. The second insulating layer together with the first insulation layer form a third insulating layer. The third insulating layer is patterned to form an isolation layer that exposes the substrate and the buried doped region. The isolation layer extends in a second direction and crosses over the first direction. After that, a semiconductor layer is formed on the substrate.

According to the aforementioned method of forming the buried doped region in one embodiment of the present invention, the semiconductor layer exposes at least the isolation layer.

According to the aforementioned method of forming the buried doped region in one embodiment of the present invention, the method of forming the semiconductor layer includes performing a chemical vapor deposition (CVD) process using silane ($SiH_4$) as the reactive gas.

According to the aforementioned method of forming the buried doped region in one embodiment of the present invention, the method of forming the semiconductor layer includes performing a chemical vapor deposition (CVD) process or an epitaxial process. The material constituting the semiconductor layer includes mono crystalline silicon, polysilicon or amorphous silicon. The reactive gas used in the process of forming the semiconductor layer includes silane.

According to the aforementioned method of forming the buried doped region in one embodiment of the present invention, the method of forming the first insulating layer and the second insulating layer includes performing a chemical vapor deposition (CVD) process. The material constituting the first insulating layer and the second insulating layer includes silicon oxide. The reactive gas used in the process of forming the first insulating layer and the second insulating layer includes silane or tetra-ethyl-ortho-silicate (TEOS).

According to the aforementioned method of forming the buried doped region in one embodiment of the present invention, after forming the second insulating layer over the substrate, further includes performing a planarization. The method of planarizing the second insulating layer includes performing a chemical-mechanical polishing process or an etching back process. The planarization removes only a portion of the material from the non-planar second insulating layer with or without exposing the first insulating layer or removes a portion of both the first insulating layer and the second insulating layer. Hence, the thickness of the third insulating layer including the first insulating layer and the second insulating layer is reduced. Through the planarizing process, the thickness of the third insulating layer can be controlled. In other words, the height of the subsequently formed isolation layer can be precisely controlled.

According to the aforementioned method of forming the buried doped region in one embodiment of the present invention, the method of forming the buried doped region includes performing an ion implant process.

The present invention also provides an alternative method for forming a buried doped region. First, a substrate is provided. Then, a first silicon oxide layer is formed on the substrate. The first silicon oxide layer is patterned to form an opening that extends in a first direction. A buried doped region is formed in the substrate exposed by the opening. After forming a second silicon oxide layer on the substrate to fill the opening, the second silicon oxide layer is planarized so that the second silicon oxide layer and the first silicon oxide layer together form a third silicon oxide layer. The third silicon oxide layer is patterned to form an isolation layer that exposes a portion of the substrate and the buried doped region. The isolation layer extends in a second direction and crosses over the first direction. After that, a semiconductor layer that exposes at least the isolation layer is formed on the substrate.

According to the aforementioned method of forming the buried doped region in one embodiment of the present invention, the method of forming the semiconductor layer includes performing a chemical vapor deposition (CVD) process or an epitaxial process. The material constituting the semiconductor layer includes mono crystalline silicon, polysilicon or amorphous silicon.

According to the aforementioned method of forming the buried doped region in one embodiment of the present invention, the method of forming the first silicon oxide layer and the second silicon oxide layer includes performing a chemical vapor deposition (CVD) process. The reactive gas used in the process of forming the first silicon oxide layer and the second silicon oxide layer includes silane or tetra-ethyl-ortho-silicate (TEOS).

According to the aforementioned method of forming the buried doped region in one embodiment of the present invention, the process of planarizing the second silicon oxide layer further includes removing a portion of the first silicon oxide layer. The method of planarizing the second silicon oxide layer includes performing a chemical-mechanical polishing process or an etching back process. The planarization removes only a portion of the material from the non-planar second silicon oxide layer with or without exposing the first silicon oxide layer or removes a portion of both the first silicon oxide layer and the second silicon oxide layer. Hence, the thickness of the third silicon oxide layer including the first silicon oxide layer and the second silicon oxide layer is reduced. Through the planarizing process, the thickness of the third silicon oxide layer can be controlled. In other words, the height of the subsequently formed isolation layer can be precisely controlled.

According to the aforementioned method of forming the buried doped region in one embodiment of the present invention, the method of forming the buried doped region includes performing an ion implant process.

In the present invention, the buried doped region is formed before forming the isolation layer to form a structure that the buried doped region is underneath the isolation layer. In the process of forming the buried doped region, the dopants do not have to penetrate through the entire thickness of a device isolation structure. Consequently, the ion implant depth is reduced and energy required to perform the ion implant process is minimized. With a smaller implant depth, the ion implant process is easier to control and the production cost decreases.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
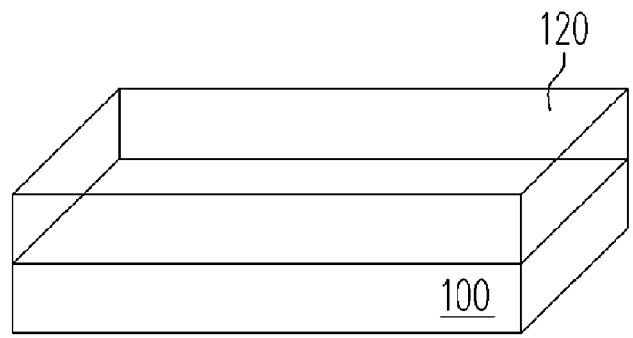
FIGS. 1A through 1E are schematic cross-sectional views showing the steps for producing a buried doped region according to one preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1E are schematic cross-sectional views showing the steps for producing a buried doped region according to one preferred embodiment of the present invention. To describe as simply and clearly the present invention as possible, the process of fabricating a single line of buried doped region is shown in FIGS. 1A through 1E. In practice, it is possible to form a multitude of buried doped regions underneath the isolation layer.

As shown in FIG. 1A, a substrate 100 such as a silicon substrate is provided. Then, an insulating layer 120 is formed on the substrate 100. The insulation layer 120 is a silicon oxide layer formed, for example, by performing a chemical vapor deposition process. When the insulating layer 120 is fabricated from silicon oxide, the reactive gas used in the chemical vapor deposition process is silane ($SiH_4$) or tetra-ethyl-ortho-silicate (TEOS), for example. However, the insulating layer 120 can be fabricated using other material having an insulating property including silicon nitride, silicon oxynitride or low dielectric constant material (with a dielectric constant smaller than 4).

Figure 1B:
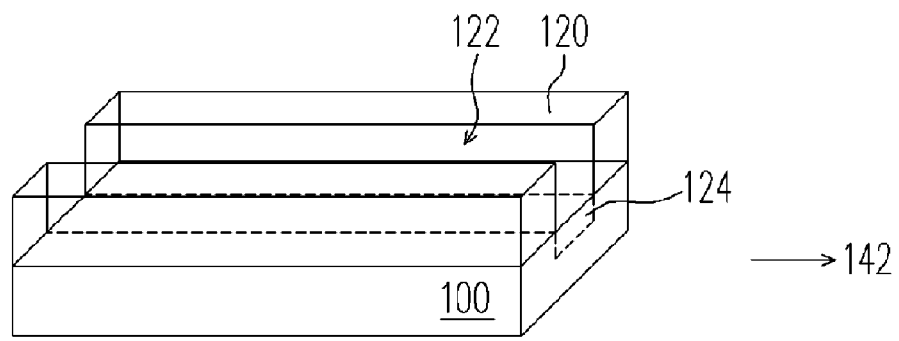

As shown in FIG. 1B, the insulating layer 120 is patterned to form an opening 122 that extends in the direction 142. The method of patterning the insulating layer 120 includes, for example, performing a photolithographic and etching process. Thereafter, a buried doped region 124 is formed in the substrate 100 exposed by the opening 122. The buried doped region 124 is formed, for example, by performing an ion implantation. The ions implanted into the substrate 100 in the ion implantation include N-type dopants or P-type dopants such as boron ions or arsenic ions, for example.

Figure 1C:
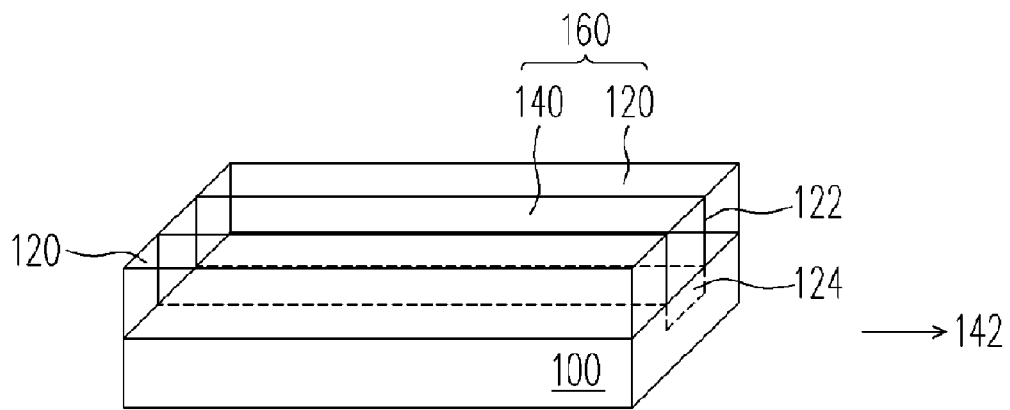

As shown in FIG. 1C, another insulation layer 140 is formed on the substrate 100 to fill the opening 122. The insulating layer 120 and the insulating layer 140 together constitute yet another insulating layer 160. The insulating layer 140 is a silicon oxide layer formed, for example, by performing a chemical vapor deposition process. When the insulating layer 120 is a silicon oxide layer, the reactive gas used in the chemical vapor deposition process is silane or tetra-ethyl-ortho-silicate, for example. After forming the insulating layer 140, the insulating layer 140 is planarized by performing a chemical-mechanical polishing process or an etching back process, for example. The planarization process can be controlled to remove only the non-planar insulating layer 140 with or without exposing the insulating layer 120 or further remove the insulating layer 120 and the insulating layer 140 so that the thickness of the insulating layer 160 is reduced. Therefore, through the planarization process, the thickness of the insulating layer 160 and thus the height of the subsequently formed isolation layer 160a can be controlled.

Figure 1D:
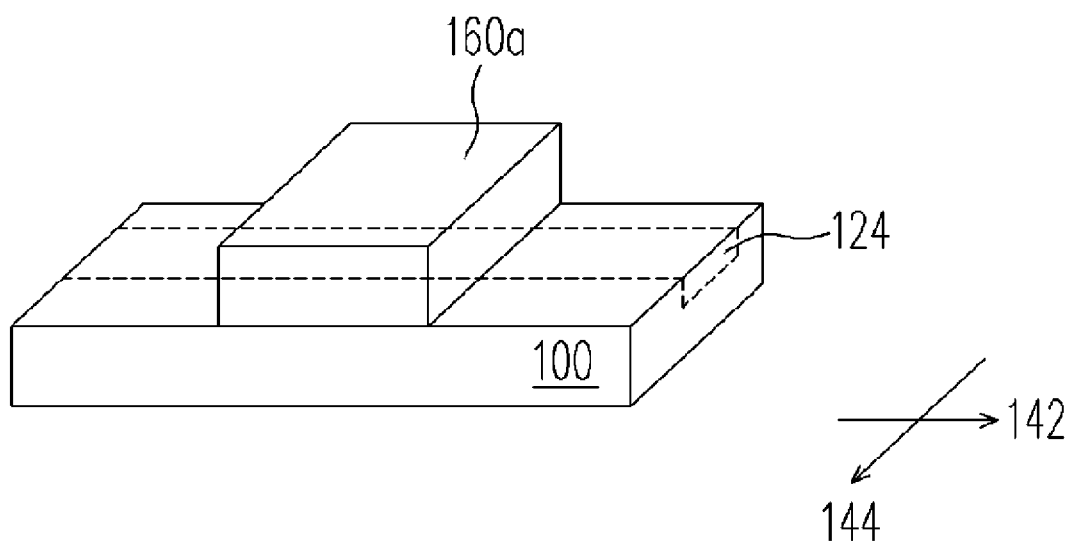

As shown in FIG. 1D, the insulating layer 160 is patterned to form an isolation layer 160a that exposes a portion of the substrate 100 and a portion of the buried doped region 124. The method of patterning the insulating layer 160 includes, for example, performing a photolithographic and etching process. The isolation layer 160a extends in another direction 144 such that the direction 144 and the direction 142 cross over each other.

Figure 1E:
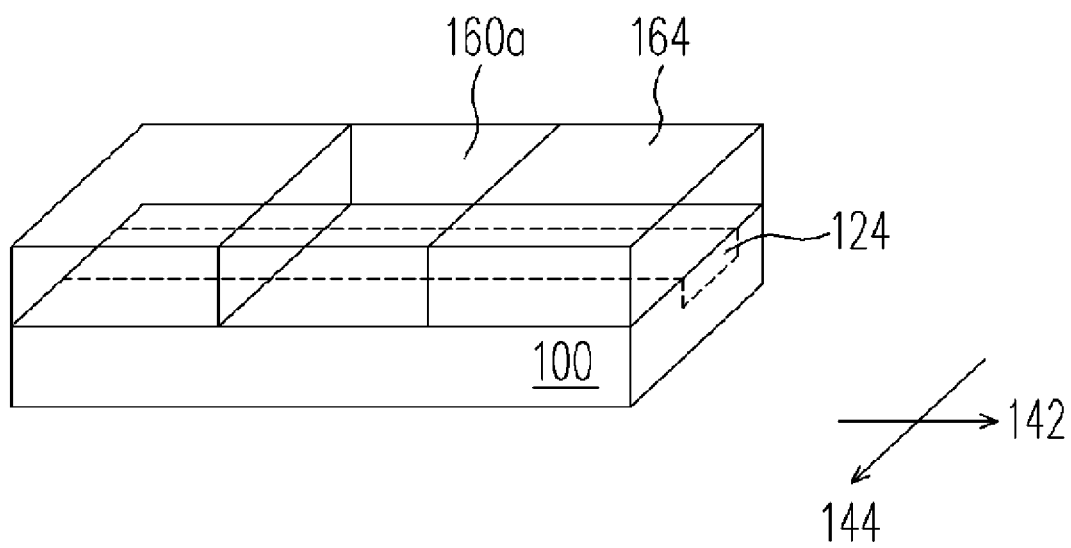

As shown in FIG. 1E, a semiconductor layer 164 is formed over the substrate 100 to expose a portion of the isolation layer 160a according to the specification of the product. In other words, the semiconductor layer 164 completely fills the area on the respective sides of the isolation layer 160a. The semiconductor layer 164 is fabricated from a material including mono crystalline silicon, polysilicon, amorphous silicon or other semiconductor material such as germanium, for example. When the semiconductor layer 164 is fabricated using a silicon-containing material, the method of forming the semiconductor includes performing a chemical vapor deposition process or an epitaxial process using silane as the reactive gas.

In the aforementioned method of forming the buried doped region, an etching stop layer may be added to control the process as required. Since the technique of forming the etching stop layer should be familiar, a detailed description is omitted.

In the present invention, the buried doped region is formed before depositing the isolation layer to form a structure that the buried doped region is underneath the isolation layer. In the process of forming the buried doped region, the dopants do not have to penetrate through the entire thickness of an isolation structure. Hence, the ion implant depth is significantly reduced.

In summary, the major advantages of the method for forming the buried doped region in the present invention includes.

1. The energy needed to perform the ion implantation is reduced. Therefore, the production cost can be reduced.

2. It is easier to control the ion implant depth.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a buried doped region, comprising:
   providing a substrate;
   forming a first insulating layer on the substrate;
   patterning the first insulating layer to form an opening that exposes a portion of the substrate, wherein the opening extends in a first direction;
   forming a buried doped region in the substrate exposed by the opening;
   forming a second insulating layer over the substrate to fill the opening, wherein the second insulating layer and the first insulating layer together form a third insulating layer;
   patterning the third insulating layer to form an isolation layer that exposes a portion of the substrate and the buried doped region, wherein the isolation layer extends in a second direction such that the second direction and the first direction cross over each other; and
   forming a semiconductor layer over the substrate.

2. The method of claim 1, wherein the step of forming the semiconductor layer comprises performing a chemical vapor deposition process.

3. The method of claim 2, wherein the material constituting the semiconductor layer is selected from a group consisting of mono crystalline silicon, polysilicon and amorphous silicon.

4. The method of claim 1, wherein the step of forming the semiconductor layer comprises performing an epitaxial process.

5. The method of claim 4, wherein the step of forming the semiconductor layer comprises using silane as the reactive gas.

6. The method of claim 1, wherein the step of forming the first insulating layer and the second insulating layer comprises performing a chemical vapor deposition process.

7. The method of claim 1, wherein the material constituting the first insulating layer and the second insulating layer comprises silicon oxide.

8. The method of claim 7, wherein the step of forming the first insulating layer and the second insulating layer comprises using tetra-ethyl-ortho-silicate (TEOS) as the reactive gas.

9. The method of claim 1, wherein after forming the second insulating layer on the substrate, further comprises planarizing the second insulating layer.

10. The method of claim 9, wherein the step of planarizing the second insulating layer comprises performing a chemical-mechanical polishing process or an etching back process.

11. The method of claim 1, wherein the step of forming the buried doped region comprises performing an ion implant process.

12. The method of claim 1, wherein the semiconductor layer exposes at least the isolation layer.

13. A method for forming a buried doped region, comprising:
   providing a substrate;
   forming a first silicon oxide layer on the substrate;
   patterning the first silicon oxide layer to form an opening that exposes a portion of the substrate, wherein the opening extends in a first direction;
   forming a buried doped region in the substrate exposed by the opening;
   forming a second silicon oxide layer over the substrate to fill the opening;
   planarizing the second silicon oxide layer so that the second silicon oxide layer and the first silicon oxide layer together form a third silicon oxide layer;
   patterning the third silicon oxide layer to form an isolation layer that exposes a portion of the substrate and the buried doped region, wherein the isolation layer extends in a second direction and the second direction and the first direction cross over each other; and forming a semiconductor layer over the substrate, wherein the semiconductor layer exposes at least the isolation layer.

14. The method of claim 13, wherein the step of forming the semiconductor layer comprises performing a chemical vapor deposition process.

15. The method of claim 14, wherein the material constituting the semiconductor layer is selected from a group consisting of mono crystalline silicon, polysilicon and amorphous silicon.

16. The method of claim 13, wherein the step of forming the semiconductor layer comprises performing an epitaxial process.

17. The method of claim 13, wherein the step of forming the first silicon oxide layer and the second silicon oxide layer comprises performing a chemical vapor deposition process.

18. The method of claim 13, wherein the step of forming the first silicon oxide layer and the second silicon oxide layer comprises using silane or tetra-ethyl-ortho-silicate (TEOS) as the reactive gas.

19. The method of claim 13, wherein the step of planarizing the second silicon oxide layer comprises removing a portion of the first silicon oxide layer.

20. The method of claim 13, wherein the step of planarizing the second silicon oxide layer comprises performing a chemical-mechanical polishing process or an etching back process.

21. The method of claim 13, wherein the step of forming the buried doped region comprises performing an ion implant process.

* * * * *